United States Patent [19]
Brabazon et al.

[11] Patent Number: 6,008,083
[45] Date of Patent: Dec. 28, 1999

[54] PRECISION ANALOG METAL-METAL CAPACITOR

[75] Inventors: Terry J. Brabazon, Essex Junction, Vt.; Badih El-Kareh, Hopewell Junction, N.Y.; Stuart R. Martin, Hinesburg, Vt.; Matthew J. Rutten, Milton, Vt.; Carter W. Kaanta, Colchester, Vt.

[73] Assignee: International Business Machines Corporation, Armonk, N.Y.

[21] Appl. No.: 08/820,930

[22] Filed: Mar. 19, 1997

Related U.S. Application Data

[62] Division of application No. 08/549,450, Oct. 27, 1995, Pat. No. 5,708,559.

[51] Int. Cl.⁶ .............................................. H01L 21/8242
[52] U.S. Cl. ........................................ 438/239; 438/253
[58] Field of Search .................................. 438/238, 239, 438/253–256, 381, 396–399

[56] References Cited

U.S. PATENT DOCUMENTS

| | | | |
|---|---|---|---|
| 3,988,824 | 11/1976 | Bodway | 29/577 |
| 4,153,988 | 5/1979 | Doo | 29/626 |
| 4,450,048 | 5/1984 | Gaulier | 204/15 |
| 4,453,199 | 6/1984 | Ritchie | 361/306 |
| 4,466,177 | 8/1984 | Chao | 29/571 |
| 4,481,283 | 11/1984 | Kerr et al. | 430/319 |
| 4,571,816 | 2/1986 | Dingwall | 29/571 |
| 4,628,405 | 12/1986 | Lippert | 361/321 |
| 4,636,833 | 1/1987 | Nishioka | 357/71 |
| 4,638,400 | 1/1987 | Brown | 361/304 |
| 4,861,141 | 8/1989 | Nakazawa | 350/336 |
| 4,864,464 | 9/1989 | Gonzalez | 361/311 |
| 4,914,497 | 4/1990 | Kondo | 357/51 |
| 4,948,747 | 8/1990 | Pfiester | 437/60 |
| 4,959,705 | 9/1990 | Lemnois | 357/51 |
| 4,982,309 | 1/1991 | Shepherd | 361/321 |
| 4,989,053 | 1/1991 | Shelton | 357/23.5 |
| 4,997,794 | 3/1991 | Wilhelmus | 437/228 |
| 5,036,020 | 7/1991 | Tigelaar | 437/60 |
| 5,037,772 | 8/1991 | McDonald | 437/52 |
| 5,162,258 | 11/1992 | Lemnois | 437/184 |
| 5,208,726 | 5/1993 | Apel | 257/532 |
| 5,268,315 | 12/1993 | Prasad | 437/31 |
| 5,366,920 | 11/1994 | Yamamichi et al. | 437/52 |
| 5,478,772 | 12/1995 | Fazan | 437/60 |
| 5,624,864 | 4/1997 | Arita et al. | 437/3 |

FOREIGN PATENT DOCUMENTS

| | | | |
|---|---|---|---|
| 0255911 | 7/1987 | European Pat. Off. | 23/52 |
| 4-112563 | 12/1992 | Japan | 27/4 |

OTHER PUBLICATIONS

J.K. Howard, Ultra–High Capacitance Structure, IBM Technical Disclosure Bulletin, vol. 25, No. 7B (Dec. 1982).

L.M. Arzubi and R.L. Bishop, Metal–Oxide Semiconductor Capacitor, IBM Technical Disclosure Bulletin, vol. 17 No. 6 (Nov. 1974).

S.T. Nguyen and T. Proch, Vertical Capacitor VLSI Structure For High Voltage Application, IBM Technical Disclosure Bulletin, vol. 32 No. 7 (Dec. 1989).

*Primary Examiner*—Joni Chang
*Attorney, Agent, or Firm*—Heslin & Rothenberg, P.C.

[57] ABSTRACT

A precision analog metal-metal capacitor is fabricated by forming a first capacitor plate in an insulation layer by forming a trench therein, depositing metal within the trench and planarizing the device. A thin dielectric layer is then deposited and patterned over the first capacitor plate. A second insulator is then deposited over the device and discrete openings etched therein to expose the insulation layer and first metal plate. Metal is deposited within the openings and planarized, thereby forming a contact to the first metal plate and the second metal plate of the capacitor.

21 Claims, 8 Drawing Sheets

PRECISION ANALOG METAL-METAL CAPACITOR

CROSS REFERENCE TO RELATED APPLICATION

This application is a division of earlier application Ser. No. 08/549,450, filed Oct. 27, 1995, now U.S. Pat. No. 5,708,559.

TECHNICAL FIELD

The present invention relates to capacitors for microelectronic devices. More particularly, the present invention relates to metal-metal capacitors having well defined capacitive values and methods for reliably producing the same.

BACKGROUND OF THE INVENTION

It is well known that capacitors are critical components in today's integrated circuits. For example, capacitors play an important role in devices having analog circuits constructed on the integrated circuit chips, often being placed adjacent the device circuitry to carry out de-coupling functions. However, achieving the desired capacitance characteristics is often difficult due to several trends in the industry, namely increasing device density (e.g. VLSI designs) and increasing frequency of operating signals. First, since increased device densities has been achieved largely by the miniaturization of individual devices, it requires a similar miniaturization in capacitor structure, thereby placing a much greater importance on a high capacitance value per unit area. Second, higher operating frequencies have also increased the level of parasitic capacitance and cross-talk experienced between adjacent signal lines or metallization levels thereby increasing the demand upon many capacitors. However, fabrication of capacitance devices within or immediately adjacent the integrated circuit is often limited by VLSI design patterning rules. This is particularly true for capacitors intended for use in analog circuitry placed in immediate proximity to the metallization levels.

In light of the aforesaid requirements and limitations, present capacitor structures suffer from severe non-linearities (in capacitance value) caused by large voltage coefficient ratios (VCR), parasitic capacitances, resistances or combinations of the same. The existence of such non-linearities significantly limits the application and usefulness of the capacitor in analog circuits. However, solutions directed at improving the characteristics of such capacitors must comply with VLSI design patterning limitations, BEOL (back-end of the line) techniques, and spacial limitations. In addition, solutions complying with these requirements should not unduly increase the complexity of the device processing nor the cost of the resulting device. Thus, designs directed at addressing this problem have largely attempted to solve the problem using numerous masking and etching steps in the formation of the dielectric layers and multiple capacitor plates. Moreover, in order to comply with VLSI design patterning rules, commonly one of the capacitor plates will comprise doped polysilicon. In this regard such methods themselves suffer considerable drawbacks. Polysilicon materials offer significant resistances which become particularly problematic in devices having high frequency operating signals. Moreover, standard BEOL etches may often create structural irregularities that detract from the ability to repeatably and reliably fabricate a capacitor of a given capacitance value.

Therefore, there exists a need for a capacitive structure having high capacitance values per surface area that may be employed within integrated circuits, such as within the metallization levels of microelectronic devices. There further exists a need for a capacitive structure having a low VCR, in particular a VCR below 10 ppm/V. There further exists a need for a capacitive structure in which the capacitive value varies less than 1%. There further exists a need for a method of fabricating such capacitive structures that are compatible with VLSI design patterning rules, such as those using standard BEOL processing techniques. There further exists a need for such methods that allow reliable and repeatable fabrication of capacitive structures of a precise capacitance value.

SUMMARY OF THE INVENTION

The aforesaid needs are fulfilled and the problems of the prior art overcome by the present invention which in one aspect relates to a method of making a capacitor in a semiconductor device comprising:

forming a first insulation layer over a semiconductor substrate, wherein the first insulation layer has a cavity therein;

depositing a metal within the cavity and planarizing the metal, thereby forming a first metal layer;

forming a dielectric layer over the first metal layer; and forming a second metal layer over the dielectric layer wherein the first metal layer and the second metal layer remain electrically insulated from one another.

In a further aspect the above method may further comprise:

forming a second insulation layer over the device after forming the dielectric layer;

creating a first aperture within the second insulation layer, over the dielectric layer, wherein the aperture does not expose said first metal layer; and depositing metal in said aperture and planarizing said metal, thereby forming said second metal layer.

In a further aspect, the invention relates to a method of making a capacitor in a semiconductor device comprising:

forming a first planarized insulation layer over a semiconductor substrate;

forming a first metal layer over the first insulation layer;

forming a dielectric layer over a portion of the first metal layer;

forming a second metal layer over the first metal layer and the dielectric layer;

patterning the first and second metal layers, thereby forming a metal plate and a contact, wherein said metal plate is fully landed upon the dielectric layer and discrete from said contact;

In a further aspect, the invention relates to a method of making a capacitor in a single insulation layer of a semiconductor device comprising:

forming a first insulation layer having a contact pad over a semiconductor substrate;

forming a second insulation layer over the semiconductor substrate wherein the second insulation layer has a first aperture over and exposing the contact pad, and wherein the aperture is defined by an interior surface;

forming a first metal layer over the interior surface of the aperture wherein the aperture is not completely filled;

forming a dielectric layer within said aperture and over said first metal layer;

depositing a metal in the unfilled portion of the aperture; and planarizing said device.

In a further aspect, the invention relates to a method of making a capacitor in a semiconductor device comprising:

depositing a first insulation layer over a semiconductor device and planarizing the first insulation layer;

forming a first metallization layer over the first planarized insulation layer;

depositing a second insulation layer over both the first metallization layer and the first insulation layer;

etching a trench and a stud opening into the second insulation layer, wherein the trench and stud opening each expose said first metallization layer, and wherein the trench is defined by an interior surface;

forming a dielectric layer over the interior surface of the trench wherein a said trench is not completely filled;

depositing a metal over the dielectric layer within said trench, wherein said trench is completely filled, thereby forming a second metal plate;

depositing metal in said stud opening wherein said stud opening is completely filled, thereby forming a stud;

planarizing the device; and forming a second metallization layer over the second insulation layer in contact with the second metal plate.

In a further aspect, the invention relates to a capacitor in a single insulation layer on a semiconductor device comprising:

a first insulation layer having a contact pad and a metallization level;

a second insulation layer overlying the first and having a filled aperture therein over the contact pad, said aperture being defined by an interior perimeter;

a first metal layer within the aperture, adjacent the perimeter of the aperture;

a dielectric layer over the first metal layer and within the aperture;

a second metal layer within the aperture and over the dielectric layer, wherein the first metal layer, the dielectric layer and second metal layer fill said aperture and form a capacitor within said second insulation layer.

In a further aspect, the invention relates to a capacitor in a semiconductor device comprising:

a first insulation layer over a semiconductor device, said first insulation layer having a planarized first metal layer positioned therein;

a dielectric layer over a portion of the first metal layer;

a second insulation layer over the first insulation layer, first metal layer and dielectric layer, wherein a second planarized metal layer extends through the second insulation layer over said dielectric layer.

In a further aspect, the invention relates to a capacitor in a semiconductor device, comprising:

a semiconductor substrate;

a planarized first insulation layer over the semiconductor substrate;

a first metallization level over the first insulation layer;

a second insulation layer positioned over both the first insulation layer and first metallization level, and wherein the second insulation layer has a filled trench defined by an interior, wherein the filled trench comprises a dielectric layer positioned adjacent the perimeter of the trench and a planarized metal plate over said dielectric layer;

a metal stud extending through said second insulation layer and contacting said metallization level;

a second metallization layer over and in contact with said metal plate.

DESCRIPTION OF THE INVENTION

Figure 1:
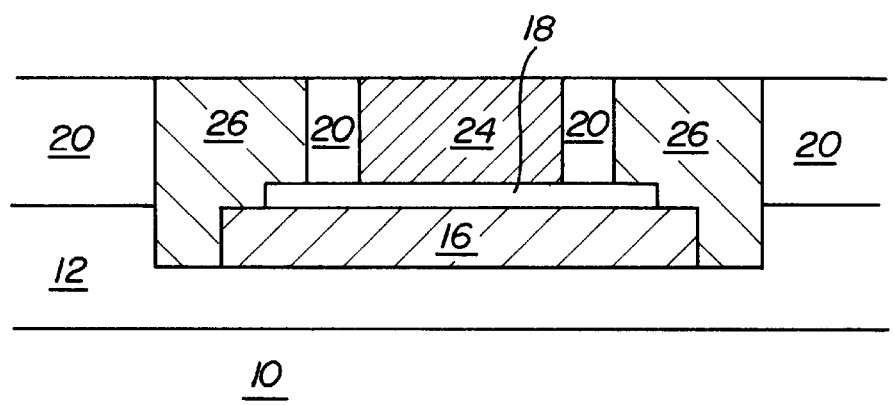
FIG. 1 is a cross-sectional view of a metal-metal capacitor.
Figure 2:
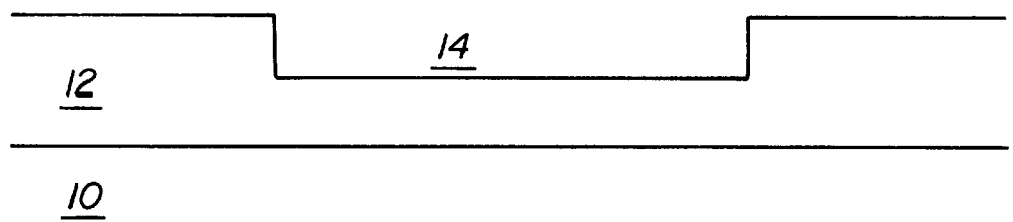
FIGS. 2–5 are cross-sectional views of structures created in the fabrication of the metal-metal capacitor of FIG. 1.

A semiconductor device of the present invention, an embodiment of which may be seen in reference to FIG. 1, may comprise a semiconductor substrate 10 over which is positioned a first insulation layer 12 having a first metal plate 16 formed therein. A second insulation layer 20, over the first insulation layer 12, having a second metal plate 24 and studs 26 extending therein. The studs 26 extend through the second insulation layer 20 and contact the first metal plate 16. A thin dielectric layer 18 covers a substantial portion of the first metal plate 16 and is positioned between the second metal plate 24 and first metal plate 16. The studs 26 and the second metal plate 24 are discrete elements separated from one another by an insulator, such as a portions of the second insulation layer 20.

Although not shown, the semiconductor substrate 10 is intended to include numerous active electronic devices and passive electronic components. The particular design of the underlying integrated circuit has not been shown in order to more clearly describe and show the aspects of the present invention. However, the semiconductor substrate 10 may often have an additional insulation layer, such as a ROX (recessed oxide) layer, immediately below the first insulation layer 12. In addition, since the present invention employs BEOL processing techniques and complies with VLSI design patterning rules, the devices of the present invention may be fabricated above or between other metallization levels. Thus, semiconductor substrate 10 may itself include additional metallization levels, wiring levels, therein.

As may be seen in reference to FIGS. 2–5, a semiconductor device of the present invention, having a capacitor with a precise capacitive value, may be reliably and repeatably fabricated. In reference to FIG. 2, a first insulation layer 12 may be conformally deposited over the semiconductor substrate 10. In the present example the first insulation layer 12 may have a thickness of 500 to 2000 nM. The first insulation layer 12 may be formed by methods well known in the art such as by chemical vapor deposition (CVD) and may comprise standard insulating materials, examples including, but not limited to, silicon oxide, tantalum oxide, silicon oxy-nitride, and boron nitride (BN).

Figure 3:
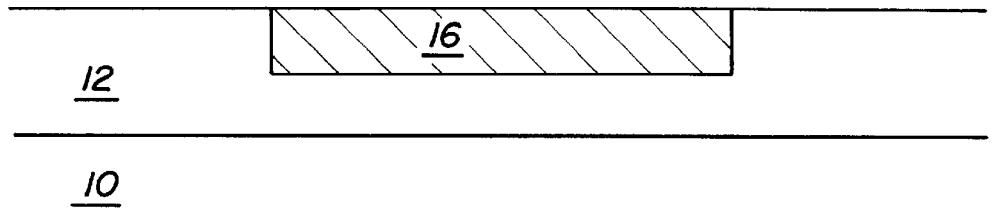

After forming the first insulation layer 12, a trench 14 may be formed therein which will ultimately define the first metal plate 16 (see FIG. 3). Using a protective layer, such as a patterned photoresist, an etch may be applied to form a trench 14 of desired dimension within the first insulation layer 12. Preferably a highly anisotropic etch that allows for the creation of well defined trenches is used. The dimensions of the trench will be dictated according to the desired dimensions of the first metal plate 16, the dimensions of which will vary in accordance with the desired capacitance characteristics and other considerations known to one skilled in the art. For example, the trench of the present example may have a depth of about 100–800 nM. Although annealing procedures may be undertaken after etching it is not believed necessary to the present invention.

As shown in FIG. 3, a metal may then be deposited within the trench by means well known in the art, examples being CVD and sputtering. The metal comprising the first plate 16 may be selected on the basis of the desired capacitance value, cost, thermal budget and other factors known to one skilled in the art. Examples of suitable metals include non-refractory and refractory metals, with preferred metals being tungsten, aluminum, gold and copper. After deposition of the metal within the trench 14, excess metal may be removed and the structure planarized by chemical mechanical polishing (CMP). Performing CMP not only removes excess metal but produces a highly uniform metal surface even with the surface of the first insulation layer 12. Examples of suitable CMP techniques are described in U.S. Pat. No. 4,985,990 issued to Cronin, et. al.; U.S. Pat. No. 4,956,313 issued to Cote, et. al.; U.S. Pat. No. 4,910,155 issued to Cote, et. al.; U.S. Pat. No. 4,721,548 issued to Morimito, et. al.; and Landis, H. et. al., "Integration of Chemical-Mechanical Polishing into CMOS Integrated Circuit Manufacturing," Thin Solid Films, Vol. 220, pp. 1–7 (1992); the contents of which are hereby incorporated by reference. Such CMP techniques allow formation of a metal plate having a surface that is co-planar with the surrounding insulator with variations of less than 50 nM and provides for reliable fabrication of a capacitor plate of uniform size and dimension that suffers few surface irregularities. Creation of such a uniform metal plate ultimately enhances the ability to repeatably produce capacitors having a specific and precise capacitance value.

Figure 4:
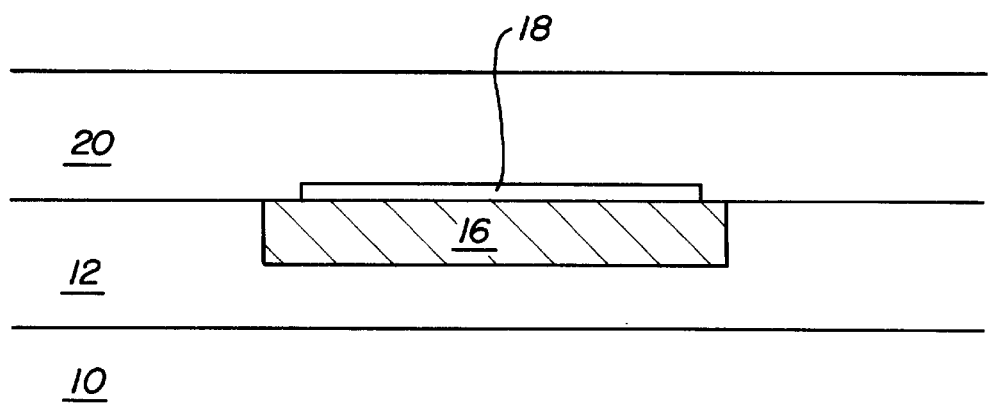

As shown in FIG. 4, a thin dielectric layer 18 may then be deposited over the first plate. The dielectric layer 16 may be deposited over the insulation layer 12 and the first metal plate 16 by means well known in the art, such as by CVD. With the aid of a patterned protective layer, such as a photoresist, the dielectric layer 18 may be itself be patterned as desired. Preferably the dielectric layer 18 is patterned so as to leave a portion of the first metal plate 16 uncovered and more preferably such that the dielectric layer 18 overlays substantially all of the first metal plate 16, leaving only opposing edges of the first metal plate 16 uncovered. Patterning of the dielectric layer is preferably accomplished using an etch that selectively etches the dielectric layer 18 relative to both the metal comprising the first plate 16 and the material comprising the first insulation layer 12.

The dielectric layer may be comprised of commonly used dielectric materials such as silicon oxide, silicon oxy-nitride or other dielectric materials. The selection of the dielectric material and thickness of the dielectric layer may depend on the desired capacitor characteristics, the dielectric constant, etch selectivities and other factors known to one skilled in the art. Generally a thin dielectric layer is preferred, in the present example a thin silicon oxide film of about 20 to 200 nM may be utilized. However, as described more thoroughly below, the selection of the material comprising the dielectric layer should be done in connection with selection of the material comprising the second insulation layer 20.

Still referring to FIG. 4, a second insulation layer 20 may then be deposited over the first insulating layer 12, the dielectric layer 18 and the exposed portions of the first metal plate 16. The second insulating layer 20 preferably comprises a material that may be selectively removed relative to the dielectric layer 18 and in the present example having a thickness of 500 to 2,000 nM. For example, the dielectric material and second insulator may be selected so as to have good etch-rate ratios with respect to each other; e.g. silicon oxide and boron nitride. Silicon oxide and boron nitride may be selectively etched with respect to one another by an etch described in Cote, D. et. al., "High Selectivity Magnetically Enhanced Reactive Ion Etching of Boron Nitride Films," J. Electrochem. Soc. (USA), Vol. 141, No. 12, (December 1994), the contents of which are incorporated herein by reference.

Figure 5:
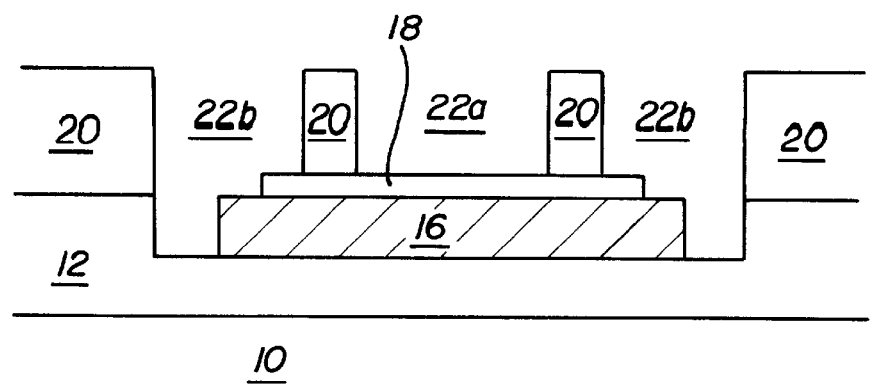

As shown in FIG. 5, portions of the second insulation layer 20 may then be selectively removed in order to form the desired openings 22 extending into the second insulation layer 20. Openings within the second insulating layer 20 may be created with the aid of a patterned photoresist and an appropriately selective anisotropic etch. As described above, the openings 22a and 22b respectively expose portions of the dielectric layer 18 and the first metal plate 16 and will define the second metal plate and contacts. The opening 22a for the second metal plate should remain electrically insulated from the first plate 16 and is preferably positioned entirely over the dielectric layer 18. The contact openings 22b may be positioned over opposing edges of the first plate 16 exposing portions of the same. As shown in FIG. 5, the openings 22b exposing the first metal plate 16 may extend into the first insulation layer 12 adjacent the first metal plate 16 thereby exposing the side edge of the first metal plate 16. In the present example, contact openings extend about 500 nM to 700 nM beyond the outer edge of metal plate 16 to insure sufficient contact. In addition, each of the openings 22 should be electrically insulated from one another, which may be achieved by maintaining a portion of the second insulation layer 20 between the individual openings 22. In the present example, openings 22a and 22b may remain separated by a 1000 nM region of the second insulation layer 20. Preferably, the etch used to form openings 22 has a good etch ratio as between the material comprising the second insulation layer and dielectric material, as discussed above, as well as a good etch ratio to metal as well.

Metal may then be deposited within the openings to form the second plate 24 and contacts 26. The metal may be deposited and planarized as described above in order to obtain similarly well defined and uniform metal structures, the resulting structure being shown in FIG. 1. One skilled in the art will appreciate that by creating an individual contact instead of a perimeter contact, the next wiring level may overpass the capacitor as needed. The second plate 24 and contacts 26 may then be interconnected with the same wiring level to devices as desired.

Figure 6:
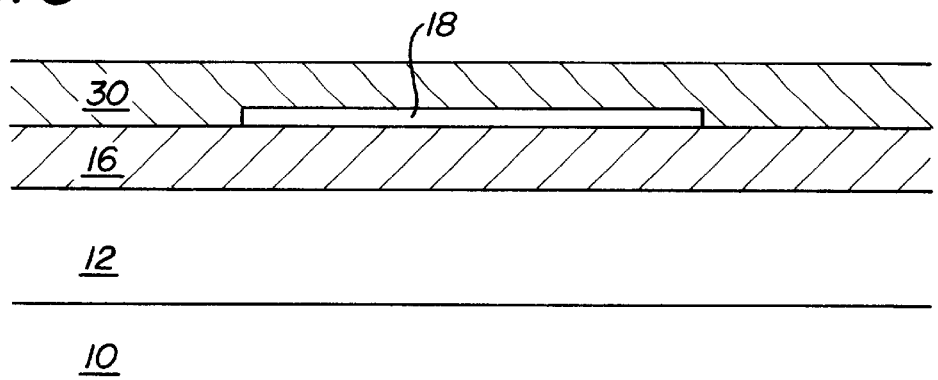
FIGS. 6 and 7 are cross-sectional views of structures created in the fabrication of the metal-metal capacitor of FIG. 8.
Figure 7:
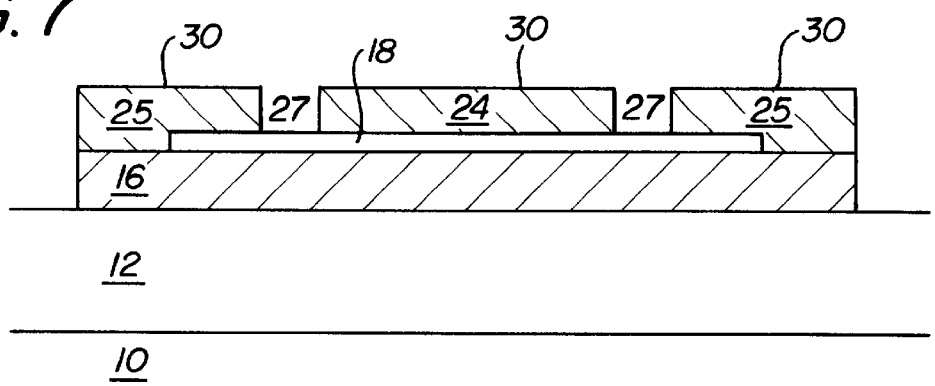
Figure 8:
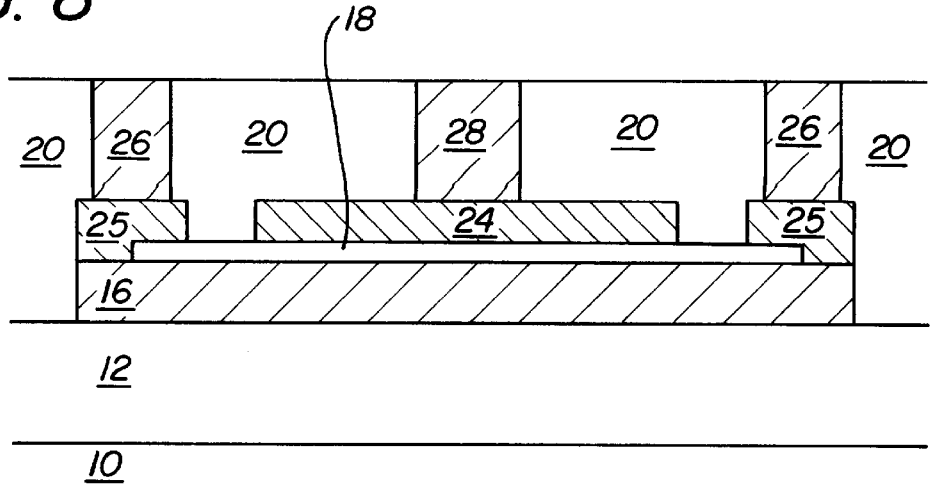
FIG. 8 is a cross-sectional view of a metal-metal capacitor.

In a further aspect of the invention, the above process may be modified in order to utilize a broader selection of etches. In reference to FIG. 6, a first insulation layer 12 may be deposited over the semiconductor substrate 10 and planarized by CMP. A first metal layer 16 may then be deposited over the first insulation layer. A dielectric layer 18 may then be deposited over the first metal layer 16 and etched followed by deposition of a second metal layer 30. As shown in FIG. 7, the first metal layer 16 and second metal layer 30 may then be patterned as desired, thereby forming a second metal plate 24 electrically isolated from said first metal layer 16. In the present example, the second metal layer may have a thickness of 300 nM to 500 nM. The dielectric layer 18 and first insulation layer 12 act as an etch stop thereby allowing the patterning of the first metal layer 16 and second metal layer 30 with a single etch. Preferably the metal layers are patterned using a patterned photoresist, and an etch that selectively etches metal relative the materials comprising the dielectric layer 18 and first insulation layer 12. Openings 27 within the second metal layer 30 are formed over the dielectric layer 18 isolating the second metal plate 24 from the contacts 25; contacts 25 being those portions of the second metal layer 30 in contact with first metal layer 16. As may be seen in FIG. 8, contact 24 and 25 may be electrically insulated from one another by a 1,000 mM thick region of the second insulation layer 20. A second insulation layer 20 may then be deposited over the device. Multiple discrete openings may then be etched into the second insulation layer 20 exposing contacts 25 and the second metal plate 24. Metal may then be deposited within the openings thereby forming studs 26 and 28 which are electrically insulated from one another. The studs and second insulation layer may then be planarized by CMP and the first metal layer and second metal plate connected to the device as desired.

Figure 9:
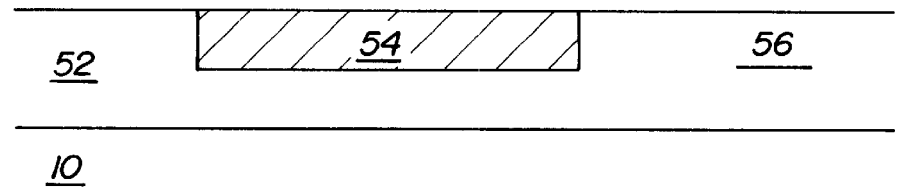
FIGS. 9–12 are cross-sectional views of structures created in the fabrication of the metal-metal capacitor of FIG. 13.
Figure 10:
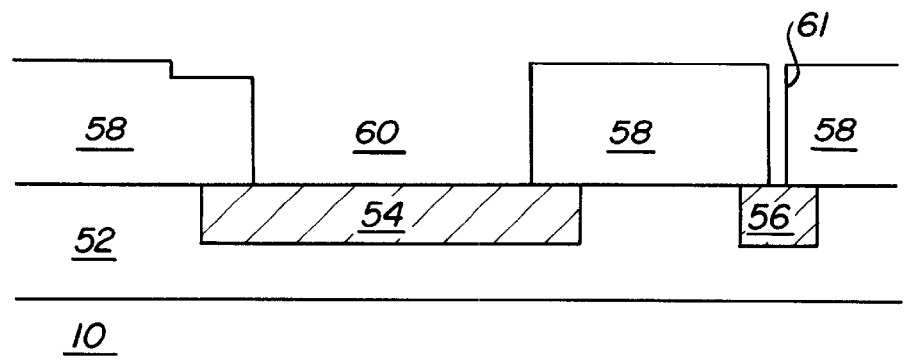

In a further aspect of the invention, the process may be modified to create a precision capacitor which is contained within a single insulation level, thereby occupying less surface area of the substrate. In reference to FIG. 9, a contact pad 54 and a first metallization level 56 are defined within the first insulation layer 52 as described above; by forming a trench in the first insulating layer 52, depositing metal therein and planarizing by CMP. As used herein a "contact pad" is defined as a conductive material, preferably a metal, which contacts one of the plates of the capacitor. In reference to FIG. 10, a second insulation layer 58 may then be deposited over the metallization level 56, contact pad 54 and first insulation layer 52. The second insulation layer of the present example may have a thickness of between 500 to 2,000 nM. As shown in FIG. 10 the second insulation layer 58 may then be etched to create openings 60 and 61 exposing the contact pad 54 and metallization level 56 respectively. In the present example the contact pad may act as an etch stop. These openings 60 and 61 may be created using a patterned protective layer, such as a photoresist, and an anisotropic etch having a good etch ratio between the metal and insulator comprising the second insulation layer. As shown in FIG. 10, the openings 60 and 61 lie exclusively over the contact pad and metallization layer so that the first plate 63 (see FIG. 11) and stud 64 (see FIG. 11) will be fully landed. As used herein, the term "fully landed" means that the contact is defined entirely over the underlying metal. The preferred dimensions of the capacitor opening 60 are determined by the ultimate capacitor value desired. The dimensions of the stud are not believed to be limited by the requirements of the device but by the capabilities of the available technology. Thus, the stud openings will vary in dimension with the particular technology utilized in fabricating the device.

In order to increase the surface area available for contacting the first metal plate 62, after etching the capacitor opening 60 and prior to depositing the metal forming the first metal plate 62, a shallow extension of the capacitor opening 60 may be created by damascene processing. As used herein the term "damascene processing" refers to additional masking, etching and planarization steps, such processing is described in greater detail in C. W. Kanta et al,. *Proceeding of the 8th International Conference on Interconnects,* ppg. 144–152 (1991), the contents of which are incorporated herein by reference. The shallow extension and first plate contact pad 63 of the present example may be 1,000 nM in length.

Figure 11:
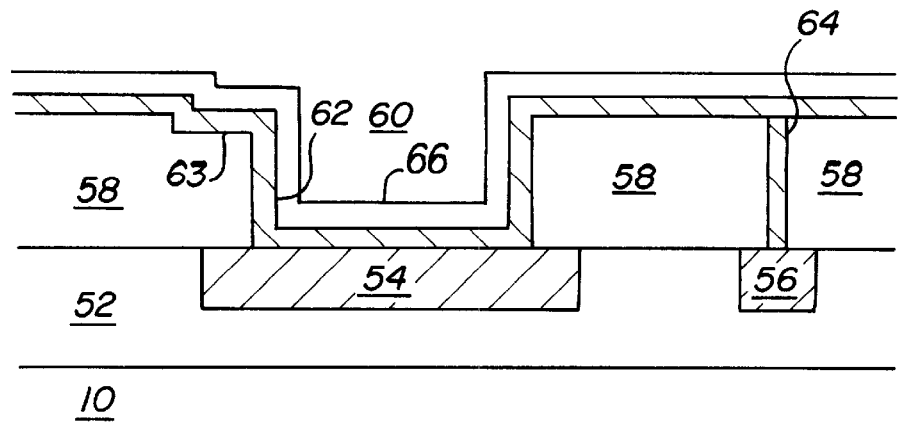

Thereafter, as shown in FIG. 11, metal may be conformally deposited over the device as described above thereby creating metallization stud 64, the first plate 62 and the first plate contact pad 63. However, the metal is preferably conformally deposited so as to completely fill the stud opening 61 and be deposited only along the sides and bottom of the capacitor opening 60 leaving a substantial portion of the opening 60 unfilled. In the present example, stud opening 61 and stud 64 are used to connect to a circuit wiring level and, thus, require a precise small dimensions so that when the metal "fill" is deposited, the opening is entirely filled without a gap. Larger openings, such as capacitor opening 60, will not fill totally. In the present example, the first plate 62 may have a thickness of 150 nM. This deposition may be accomplished by CVD techniques well known in the art since the capacitor opening 60 is of considerably greater size as compared to the metallization opening 61, e.g. tens of microns square versus about <0.7 microns.

Figure 12:
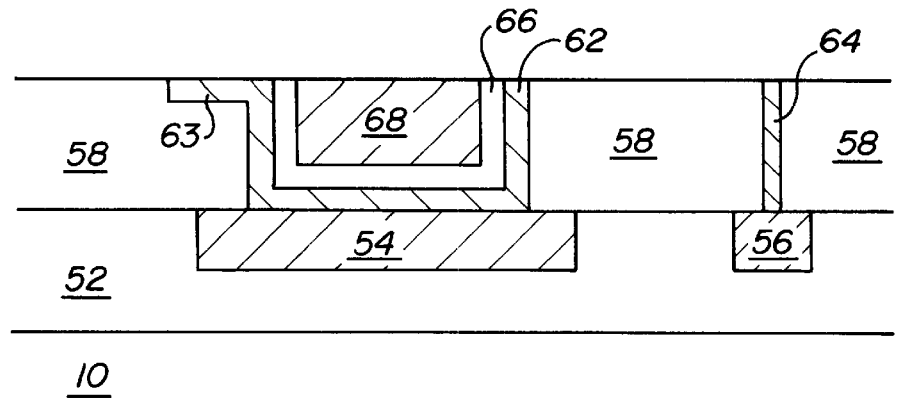

As shown in FIG. 12, a dielectric layer 66 may then be deposited over the metal layer within the capacitor opening. For example, the dielectric layer may be conformally deposited over the semiconductor device. As with formation of the first metal plate 62, the dielectric layer 66 is formed within opening 60 so as not to completely fill the opening. In the present example the dielectric layer 66 may have a thickness between 100 to 2,000 Å. A metal may then be deposited within the remainder of opening 60 and over the dielectric layer 66, so as to completely fill the opening 60, thereby forming the second metal plate 68. Thus, a metal-metal capacitor is formed within a single insulation layer. Excess metal and dielectric material may be removed from over the device and the second metal plate 68 planarized by CMP.

Figure 13:
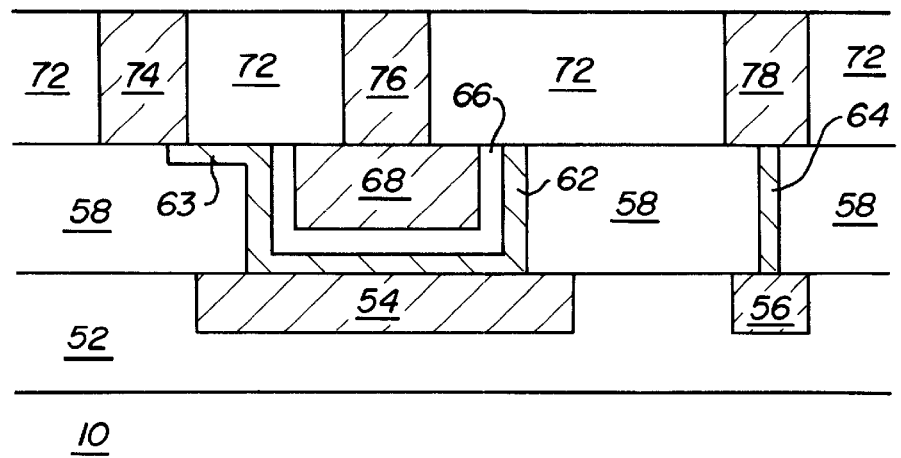
FIG. 13 is a cross-sectional side view of a metal-metal capacitor formed within a single insulation layer.

In reference to FIG. 13, a third insulation layer 72 may then be deposited over the device, such as a 1,000 nM thick layer of silicon oxide. The third insulation layer 72 may be patterned by the methods described above in order to expose the second plate 68, the metallization stud 64 and contact pad 63 to capacitor plate 62. The opening to the second plate 68 should be positioned entirely within the outer perimeter of the dielectric layer 66 and preferably entirely over the second plate 68. Openings formed within the third insulation layer 72 exposing the first plate 62, second plate 68 and metallization stud 64 may be etched such that when metal is deposited therein the individual contacts 74, 76 and 78 remain electrically insulated from one another, having regions of insulator 72 therebetween. The contacts 74, 76 and 78 may then be utilized to interconnect metallization layer 56, first metal plate 54 and second metal plate 68 to the device as desired.

Figure 14:
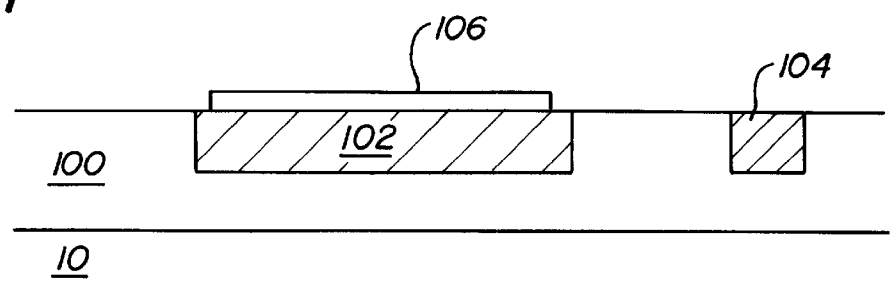
FIGS. 14–15 are cross-sectional side views of structures created in the fabrication of the metal-metal capacitor of FIG. 16.
Figure 15:
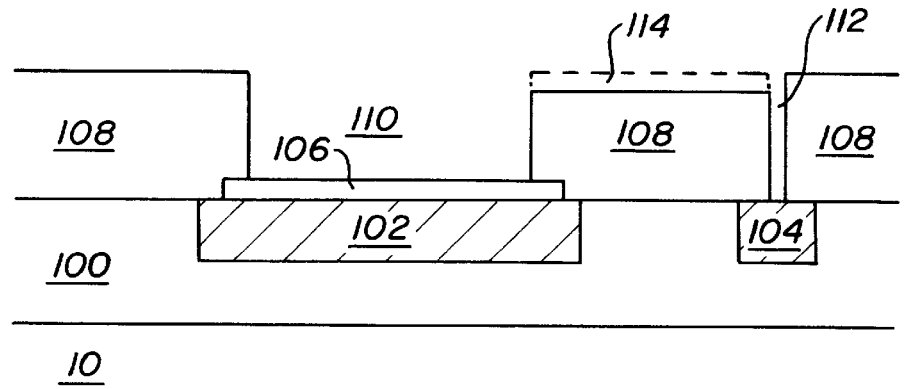
Figure 16:
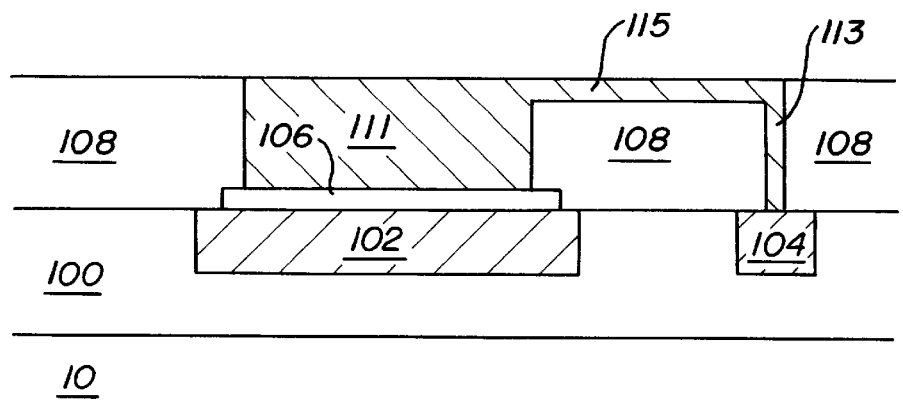
FIG. 16 is a cross-sectional side view of a metal-metal capacitor.

In a further aspect of the invention, the capacitor may be coupled to an adjacent wiring level via a short lead and a stud. As shown in FIG. 14, a first plate 102 and a metallization level 104 may be formed in a first insulating layer 100 over a semiconductor substrate 10 as described above. For example, trenches may be etched into the insulating layer 100 followed by depositing a metal within the trenches and planarizing the device by CMP. The dimension of the first metal plate is determined by the capacitance values. In reference to FIG. 15, a dielectric layer 106 may then be deposited and patterned as desired, preferably removed from over a portion of said metallization layer and remaining fully landed over the first metal plate 102. A second insulation layer 108 may then be deposited over the device. It is desirable that the materials comprising the dielectric layer and the second insulation layer are capable of being selectively etched relative to one another. The second insulation layer 108 may then be etched with the aid of a patterned resist in order to create openings 110 and 112 exposing the dielectric layer 106 and metallization layer 104, respectively. However, in order to benefit from superior etch ratios, it is possible to perform the etches in separate steps, e.g. using a first etch to expose the dielectric layer and a second etch to expose the metallization layer 104. The second plate opening 110 should be fully landed on the dielectric layer in order to prevent shorting of the capacitor should the dielectric layer not extend beyond the perimeter of the first metal plate 102. Using standard damascene procedures (additional masking and etching), a lead trench 114 may also be created which connects the openings 110 and 112. As shown in FIG. 16 metal may then be deposited within the openings 110, 112 and trench 114 and the structure planarized, thereby forming the second metal plate 111, metallization stud 113 and lead 115.

Figure 17:
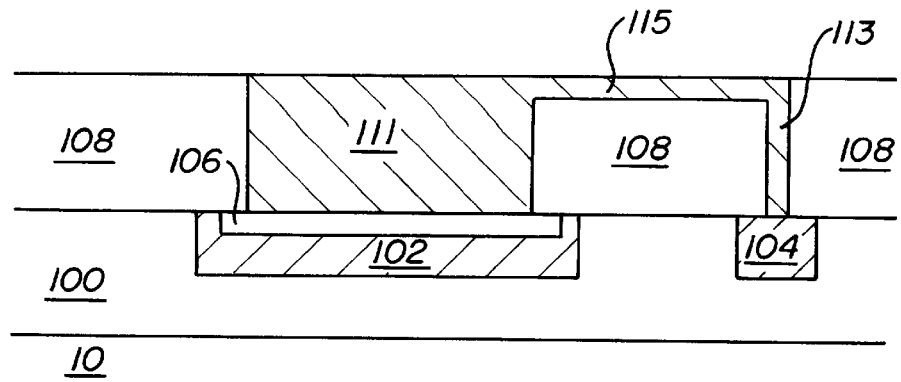
FIG. 17 is a cross-sectional side view of a metal-metal capacitor.

The method discussed immediately above may be further modified in order to utilize a broader selection of etches. In reference to FIG. 17, after forming the first plate 102 and first metallization layer 104 within the first insulating layer 100, the perimeter of the first plate 102 may be protected, such as with a patterned resist, leaving exposed only an interior of the first plate 102. The exposed portion of the first plate 102 may then be removed, such as with an anisotropic etch, to form a trench therein. This avoids the use of an etch that selectively etches between the dielectric layer 106 and the second insulation layer 108. A dielectric material, such as TEOS (tetraethoxysilane), may be deposited within the trench and the device planarized, thereby forming the dielectric layer 106 within the first metal plate 102. Thereafter, the second plate 111, the stud 113 and lead 115 may be formed as discussed above, thereby forming the structure shown in FIG. 17.

Figure 18:
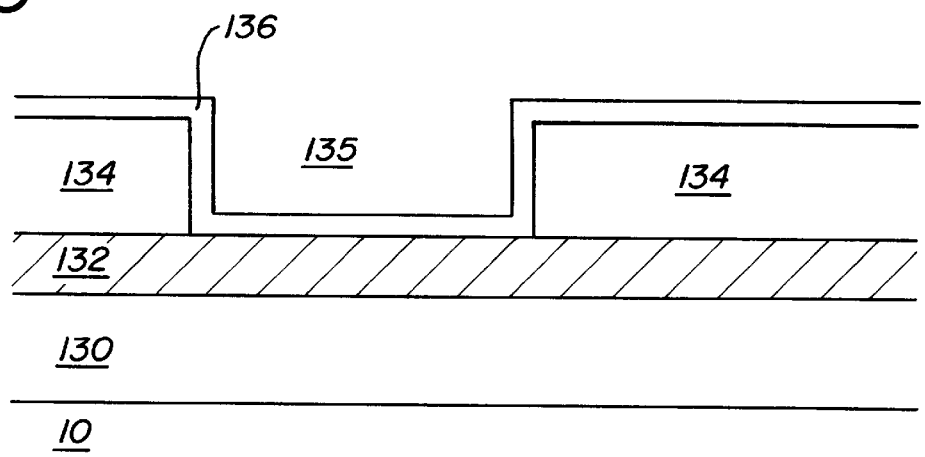
FIGS. 18–20 are cross-sectional side views of structures created in the fabrication of the metal-metal capacitor of FIG. 21.
Figure 19:
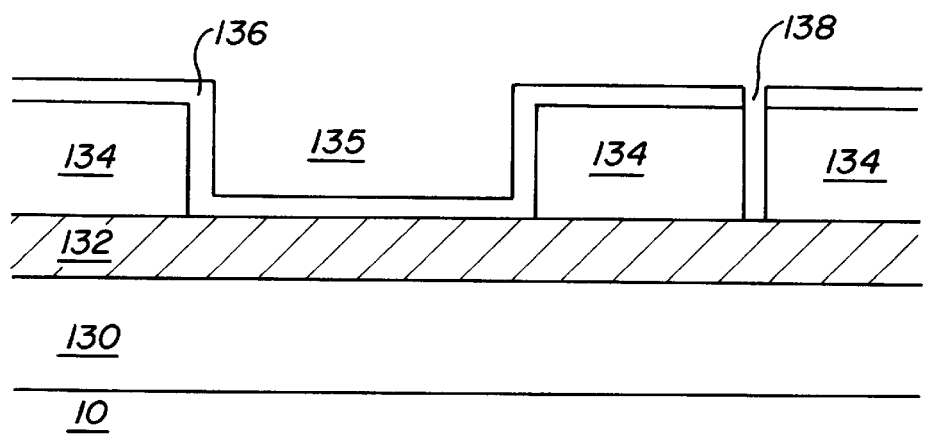
Figure 20:
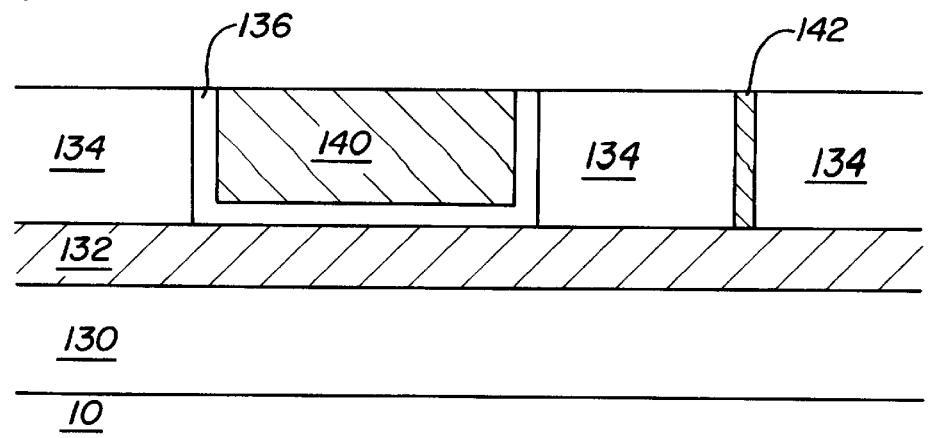
Figure 21:
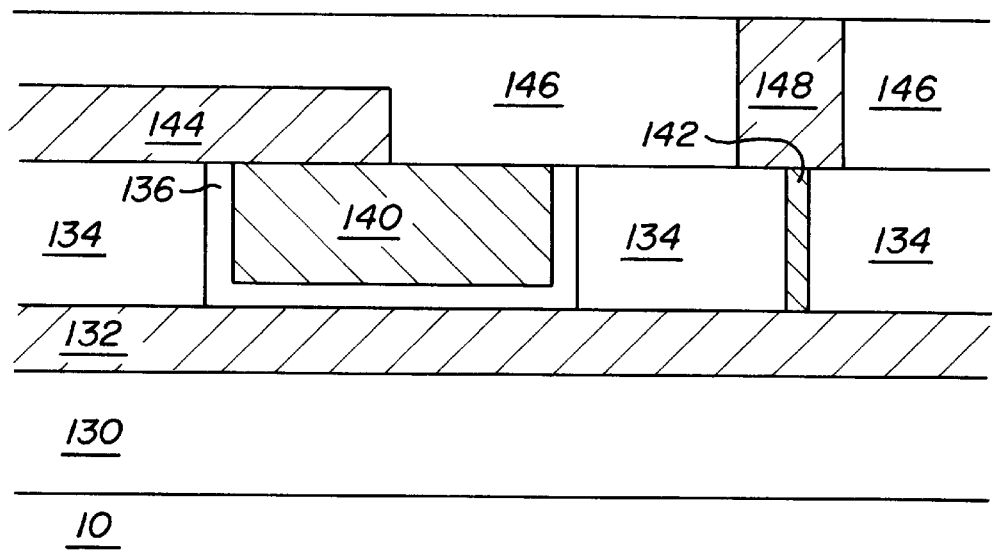
FIG. 21 is a cross-sectional side view of a metal-metal capacitor.

In a further aspect of the invention, and in reference to FIG. 18, a first insulation layer 130 is deposited over a semiconductor substrate 10 and the device planarized by CMP. A first metallization level or wiring level 132 is deposited thereover and patterned as desired. A second insulation layer 134 may then be formed over the device, such as by CVD. Preferably the second insulation layer 134 is a layer of silicon oxide 500 to 2,000 nM thick. Using a patterned photoresist, a capacitor opening 135 may be etched within the second insulation layer 134. A dielectric material may then be conformally deposited over the device and along the edges and bottom of capacitor opening 135, thereby forming a dielectric layer 136. The thickness of the dielectric layer 136 will vary in accordance with factors described above, although a preferred dielectric layer comprises a 150 nM layer for TEOS. However, the dielectric layer 136 is sufficiently thin to leave a substantial portion of the capacitor trench 135 unfilled. Then, as shown in FIG. 19, using standard BEOL techniques contact openings 138 may be created as desired exposing the first metallization layer 132. A metal, such as tungsten, may then be conformally deposited over the device, filling the remainder of the capacitor opening 135 and contact opening 138. The device is then planarized by CMP, thereby forming a highly uniform second metal plate 140 and metallization contact 142, the resulting structure being shown in FIG. 20. In reference to FIG. 21, a second metallization layer 144 may then be deposited over the planarized structure and patterned such that the second metallization level 144 is in electrical contact with the second metal plate 140. A third insulation layer 146 and contact 148 in electrical connection with the first metallization level 132 may subsequently be fabricated upon the device as desired as well as additional metallization levels thereover. One skilled in the art will appreciate that the present metal-metal capacitor may be fabricated between any two adjacent metallization levels.

Although the present invention has been particularly shown and described with reference to preferred embodiments thereof, it is not intended to be limited to the specific embodiments set forth herein; it will be understood to those skilled in the art that various changes in form and details may be made without departing from the spirit and the scope of the invention.

We claim:

1. A method of making a capacitor in a semiconductor device comprising:

forming a first insulation layer over a semiconductor substrate wherein said first insulation layer has a cavity therein, wherein the bottom and sidewalls of said cavity comprise said first insulation layer, wherein said cavity is physically separated from said semiconductor substrate by said first insulation layer;

depositing a metal within said cavity and planarizing said metal even with said first insulation layer, thereby forming a first metal layer having a bottom surface, wherein said bottom surface of said first metal layer is adjacent to said first insulation layer and said first metal layer is physically separated from said semiconductor substrate;

forming a dielectric layer over said first metal layer; and forming a second metal layer over said dielectric layer wherein said first metal layer and said second metal layer are electrically insulated from one another.

2. The method of claim 1 wherein forming said first insulation layer having a cavity therein comprises depositing a first insulation layer and then etching a trench therein.

3. The method of claim 1 wherein planarizing said metal in said cavity comprises chemical mechanical polishing said metal.

4. The method of claim 1 wherein forming said second metal layer comprises:

forming a second insulation layer over said device after forming said dielectric layer;

creating a first aperture within said second insulation layer and over said dielectric layer, wherein said first aperture does not expose said first metal layer; and depositing a second metal in said first aperture and planarizing said second metal, thereby forming said second metal layer.

5. The method of claim 4 wherein said planarizing of said second metal in said first aperture comprises chemical mechanical polishing said second metal.

6. The method of claim 4 further comprising:

creating a discrete second aperture in said second insulation layer wherein said second aperture exposes said first metal layer; and depositing said second metal in said second aperture wherein said first metal layer and said second metal layer remain electrically insulated.

7. The method of claim 4 further comprising:

forming a metallization level within said first insulation layer and proximate said first metal layer;

creating a second aperture in said second insulation layer prior to depositing said second metal in said first aperture;

depositing said second metal in said second aperture thereby forming a stud; and electrically connecting said stud and said second metal layer.

8. The method of claim 7 wherein forming said dielectric layer over said first metal layer comprises depositing a dielectric material over the device and patterning the dielectric with an etch.

9. The method of claim 7 wherein forming said dielectric layer over said first metal comprises etching a trench into said first metal layer, depositing dielectric material into said trench and planarizing said dielectric material.

10. A method of making a capacitor in a semiconductor device comprising:

forming an uninterrupted first planarized insulation layer having regular topography over a semiconductor substrate, wherein said semiconductor substrate is unexposed and covered by said first insulation layer;

forming a first metal layer over said first insulation layer without physically contacting said semiconductor substrate, wherein said first metal layer is physically separated from said semiconductor substrate by said first insulation layer;

forming a dielectric layer over a portion of said first metal layer;

forming a second metal layer over said first metal layer and said dielectric layer; and patterning said first and second metal layers, thereby forming a metal plate and a contact wherein said metal plate is fully landed upon said dielectric layer and discrete from said contact.

11. The method of claim 10 further comprising:

depositing a second insulation layer over said device and forming discrete first and second metal studs extending through said second insulation layer, wherein said first stud is positioned over said metal plate and said second stud over said contact.

12. The method of claim 10 wherein patterning said first and second metal layers comprises etching said first and second metal layers with a single etch.

13. A method of making a capacitor in a single insulation layer of a semiconductor device comprising:

forming a first insulation layer having a contact pad over a semiconductor substrate, wherein the bottom and sidewalls of said contact pad are adjacent to said first insulation layer, and said contact pad is physically separated from said semiconductor substrate by said first insulation layer;

forming a second insulation layer over said semiconductor substrate wherein said second insulation layer has a first aperture over and exposing said contact pad without exposing said first insulation layer or said semiconductor substrate, said first aperture being defined by an interior surface;

forming a first metal layer conformally over the interior surface of said first aperture;

forming a dielectric layer conformally within said first aperture and over said first metal layer;

depositing a metal in the unfilled portion of said first aperture thereby forming a second metal layer; and planarizing said device.

14. The method of claim 13 wherein planarizing said device comprises chemical mechanical polishing said device.

15. The method of claim 13 wherein forming said first metal plate comprises conformally depositing metal over the device.

16. The method of claim 13, wherein said first insulation layer has a metallization level formed therein and further comprises the steps:

creating a second aperture within said second insulation layer over and exposing said metallization level;

depositing said metal within said aperture prior to formation of said dielectric layer wherein said metal completely fills said second aperture.

17. The method of claim 16 wherein forming said first metal layer and depositing said metal within said second aperture comprises conformally depositing said metal over the device and wherein said metal completely fills said second aperture and only partially fills said first aperture.

18. The method of claim 16 further comprising:

forming a third insulation layer over said device and discrete metal studs therein in electrical contact with said first metal layer, said second metal layer and said metallization level.

19. A method of making a capacitor in a semiconductor device comprising:

depositing a first insulation layer over a semiconductor device and planarizing said first insulation layer;

forming a first metallization layer over said first planarized insulation layer;

depositing a second insulation layer over said first metallization layer and said first insulation layer;

etching a trench and a stud opening into said second insulation layer, wherein said trench and stud opening each expose said first metallization layer, and wherein said trench is defined by an interior surface;

forming a dielectric layer over the interior surface of said trench;

depositing a metal over said dielectric layer within said trench wherein said trench is completely filled, thereby forming a second metal plate;

depositing said metal in said stud opening wherein said stud opening is completely filled, thereby forming a stud;

planarizing said device; and forming a second metallization layer over said second insulation layer, in contact with said second metal plate.

20. The method of claim 19 further comprising:

depositing a third insulation layer over said second metallization layer and second insulation layer; and forming a third metallization layer over said third insulation layer.

21. The method of claim 19 further comprising:

forming a third metallization layer over said semiconductor device prior to depositing said first insulation layer.

* * * * *